United States Patent [19]
Wade

[11] 4,241,358
[45] Dec. 23, 1980

[54] RADIATION SENSITIVE DEVICE WITH LATERAL CURRENT

[75] Inventor: Edward C. Wade, Carrollton, Tex.

[73] Assignee: TRW Inc., Los Angeles, Calif.

[21] Appl. No.: 23,685

[22] Filed: Mar. 26, 1979

[51] Int. Cl.³ .............................................. H01B 27/14
[52] U.S. Cl. ....................................... 357/30; 357/22;
307/311
[58] Field of Search ...................... 357/22, 30; 307/311

[56] References Cited

U.S. PATENT DOCUMENTS

| | | | |
|---|---|---|---|
| 3,886,579 | 5/1975 | Ohuchi | 357/13 |
| 3,887,936 | 6/1975 | Shannon | 357/30 |
| 3,931,633 | 1/1976 | Shannon | 357/30 |
| 3,986,195 | 10/1976 | Arai | 307/304 |

*Primary Examiner*—Martin H. Edlow

[57] ABSTRACT

A radiation sensitive solid state device employing a lateral current and a method for shortening the turn-off time of a radiation sensitive device are disclosed. The device includes a semiconductor layer of one conductivity type and a radiation sensitive element present in the semiconductor layer. The semiconductor layer forms a low resistance lateral path beneath the radiation sensitive element. The method for shortening the turn-off time includes providing a substantially lateral flow of carriers characteristic of the one conductivity type through the semiconductor layer beneath the radiation sensitive element.

12 Claims, 3 Drawing Figures

RADIATION SENSITIVE DEVICE WITH LATERAL CURRENT

BACKGROUND OF THE INVENTION

1. Field of the Invention

The present invention relates generally to radiation sensitive solid state device and, in one of its aspects, to a photodiode which utilizes a lateral current through an N region beneath a radiation sensitive P-type element.

2. Description of the Prior Art

Typically, a photodiode comprises a N-type semiconductor layer and a light sensitive P-type element adjacent a first surface and forming a rectifying junction with the N-type layer. There is a connection of the N-type layer and a connection of the light sensitive P-type element. The photodiode is normally back biased in operation with the N-type region at a higher voltage potential than the P-type element. With no light incident upon the photodiode, only the dark leakage current flows from the connection of the N-type layer to the connection of the light sensitive P-type element. When light shines on the photodiode, typically on the P-type element, photocurrent passes through the photodiode from the connection of the N-type layer to the connection of the light sensitive P-type element. This photocurrent is normally far greater than the dark leakage current.

In most switching applications of photodiodes and phototransistors, the turn-off time is extended due to the long lifetime of the photogenerated carriers and the relatively slow diffusion velocity of these carriers. In situations where the P-type element is more heavily doped than the N-type layer, excess carriers are present throughout the N-type side of the diode when turning off and, therefore, some carriers must diffuse the entire distance across the N-type layer.

SUMMARY OF THE INVENTION

The present invention concerns a method and apparatus for shortening the turn-off time of a radiation sensitive device. A radiation sensitive solid state device according to the present invention includes a semiconductor layer of one conductivity type, a radiation sensitive element present in the semiconductor layer such as an electrode situated at or adjacent a first surface and forming a rectifying junction with the semiconductor layer of the first conductivity type, a first connection of the semiconductor layer, a second connection of the semiconductor layer spaced apart laterally from the first connection on the opposite side of the radiation sensitive element, and a connection of the radiation sensitive element. The semiconductor layer portion situated intermediate the first and second connections forms a low resistance path so that a substantially lateral flow of charge carriers characteristic of the one conductivity type can occur in order to sweep the semiconductor layer of the one conductivity type of excess carriers when the device is turned off.

In one arrangement, the electrode consists of a surface region of the opposite conductivity type in the semiconductor layer of the one conductivity type. In one embodiment, the radiation sensitive solid state device is a photodiode, and the semiconductor layer of one conductivity type is an N-type layer with the radiation sensitive element a P-type element. The substantially lateral flow of carriers creates a bias current in the range of from roughly about ½ of the maximum photogenerated current to roughly about three times the maximum photogenerated current and, in a preferred embodiment from roughly about 1½ times the maximum photogenerated current to roughly about 2½ times the maximum photogenerated current.

In one arrangement of a radiation sensitive solid state device according to the present invention, the semiconductor layer of the one conductivity type is present on a semiconductor substrate of the opposite conductivity type. In one arrangement of a photodiode according to the present invention, the vertical thickness of an N-type semiconductor layer below a P-type photosensitive element is between roughly about five microns and roughly about eight microns, preferably between roughly about six microns and roughly about seven microns.

A circuit utilizing a device according to the present invention utilizes two current splitters, one to split the lateral current from a current of an equal amount and the second to split the current of the equal amount in half. When no light is incident upon the photodiode, the lateral current leaving the second connection of the N-type layer is approximately equal to the current entering the first connection of the N-type layer. The one half of the current equal to the lateral current and the current leaving the second connection are then both multiplied by a constant and compared, the difference being used to switch an output. When light is incident upon the photodiode, roughly one half of the lateral current is robbed and the current leaving the second connection is roughly one half that entering the first connection. When the current leaving the second connection is then multiplied by the constant and compared to one half the current equal to the lateral current times the same constant, there is insufficient current left for switching the output.

These and other objects, advantages and features of this invention will be apparent from the following description taken with reference to the accompanying drawings, wherein is shown the preferred embodiments of the invention.

DETAILED DESCRIPTION

Figure 1:
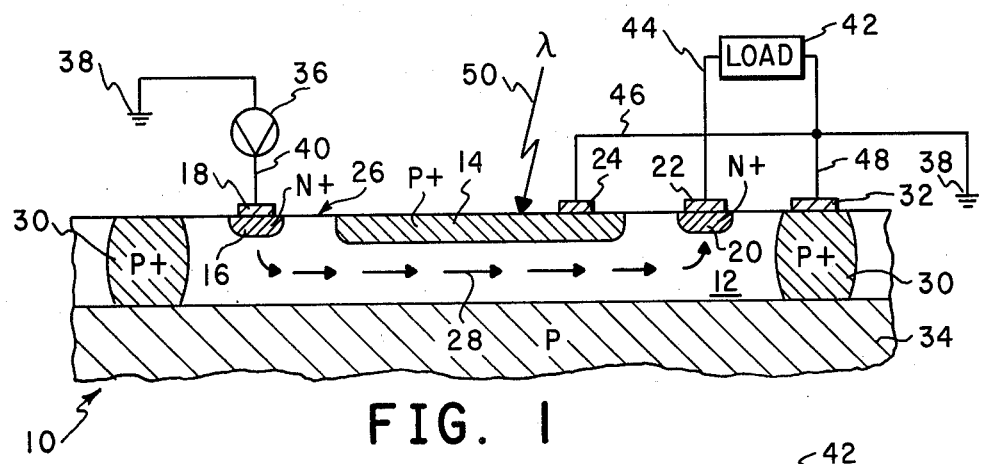
FIG. 1 is a cross-sectional view of a photodiode in accordance with the present invention along with accompanying bias circuitry showing the substantially lateral current path.

Referring now to the drawing and in particular to FIG. 1, a radiation sensitive solid state device such as a photodiode according to the present invention is referred to generally by reference numeral 10. Photodiode 10 includes a semiconductor layer 12 of one conductivity type N, a P-type radiation sensitive element 14 present in semiconductor layer 12, a first connection of the semiconductor layer comprising an N+ region 16 and a metal layer 18, and a second connection of the semiconductor layer comprising an N+ region 20 and a metal layer 22. Photodiode 10 also includes a connection of the radiation sensitive element which in this embodiment is metal layer 24. P-type radiation sensitive element 14 comprises an electrode situated at or adjacent a first surface 26 and forming a rectifying junction with the material of N-type semiconductor layer 12. In this embodiment, P-type element 14 is a P+ region which is more heavily doped than N-type semiconductor layer 12. N+ region 20 and metal layer 22 are spaced apart laterally from N+ region 16 and metal layer 18 on the opposite side of radiation sensitive element 14 wherein the portion of semiconductor layer 12 situated intermediate the connections forms a low resistance path so that a substantially lateral flow of charge carriers characteristic of the N conductivity type can occur. A pictorial illustration of the substantially lateral flow is designated by reference numeral 28. A P+ isolation diffusion area 30 encircles N-type semiconductor layer 12. A connection to isolation diffusion area 30 comprises a metal layer 32. N-type semiconductor layer 12 is present on a semiconductor substrate of the opposite conductivity type, P-type semiconductor substrate 34, first surface 26 of semiconductor layer 12 being the surface remote from substrate 34. The distance from P-type element 14 to semiconductor substrate 34 is between roughly about five microns and roughly about eight microns in one embodiment and, in a preferred embodiment, is between roughly about six microns and roughly about seven microns.

Figure 2:
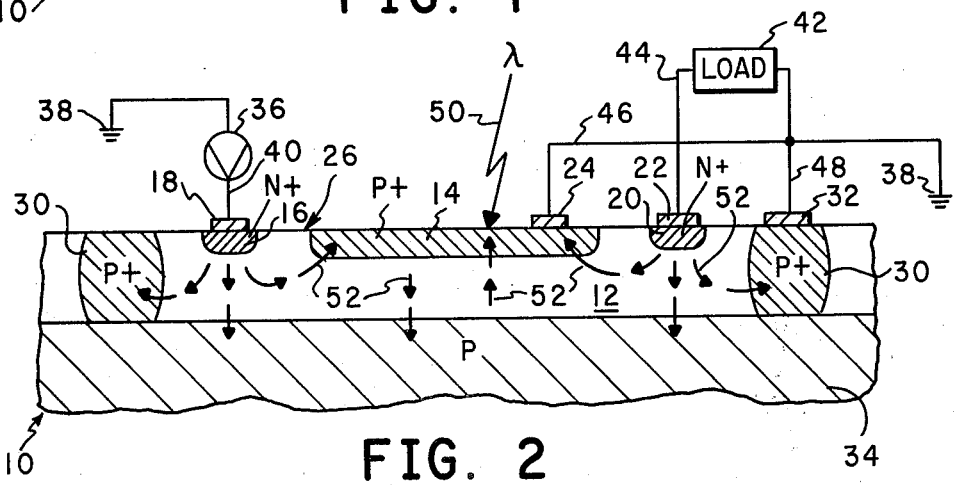
FIG. 2 is a cross-sectional view of a photodiode according to the present invention along with accompanying bias circuitry showing photocurrent paths.

A current source 36 is connected to ground 38 on one side and to metal layer 18 by lead 40 on the other. An electrical load 42 is connected between ground 38 on one side and metal layer 22 through lead 44 on the other. Metal layer 24 is connected to ground 38 by lead 46, and metal layer 32 is connected to ground by lead 48. When no light is incident upon P-type element 14, then only the dark leakage current flows from N-type semiconductor layer 12 through P-type element 14 when the photodiode is back biased. Since the dark leakage current is quite small, substantially lateral current flow 28 predominates. Referring also to FIG. 2, when light, represented pictorially by 50, is incident upon P-type element 14, then photocurrent represented pictorially by 52 flows from the N-type regions to the P-type regions. A method for shortening the turn-off time of a radiation sensitive device such as photodiode 10 having a semiconductor layer 12 of one conductivity type and a radiation sensitive element 14 present in the semiconductor layer comprising an electrode situated at or adjacent a first surface 26 and forming a rectifying junction with the semiconductor layer material of the first conductivity type wherein the semiconductor layer forms a low resistance lateral path beneath the radiation sensitive element is to provide a substantially lateral flow 28 of carriers characteristic of the one conductivity type through the semiconductor layer beneath the radiation sensitive element. Preferably, the substantially lateral flow of carriers 28 creates a bias current in the range of from roughly about one half of the maximum radiation generated current 52 to roughly about three times the maximum radiation generated current. A still more preferred range is from roughly about 1½ times the maximum radiation generated current to roughly about 2½ times the maximum radiation generated current. Thus, the slow turn-off of the photocurrent is eliminated by the fast transport mechanism of the lateral bias current. Photocurrent 52 tends to rob load 42 of lateral bias current 28 during illumination, and the lateral bias current 28 tends to sweep N-type semiconductor layer 12 of excess carriers.

Figure 3:
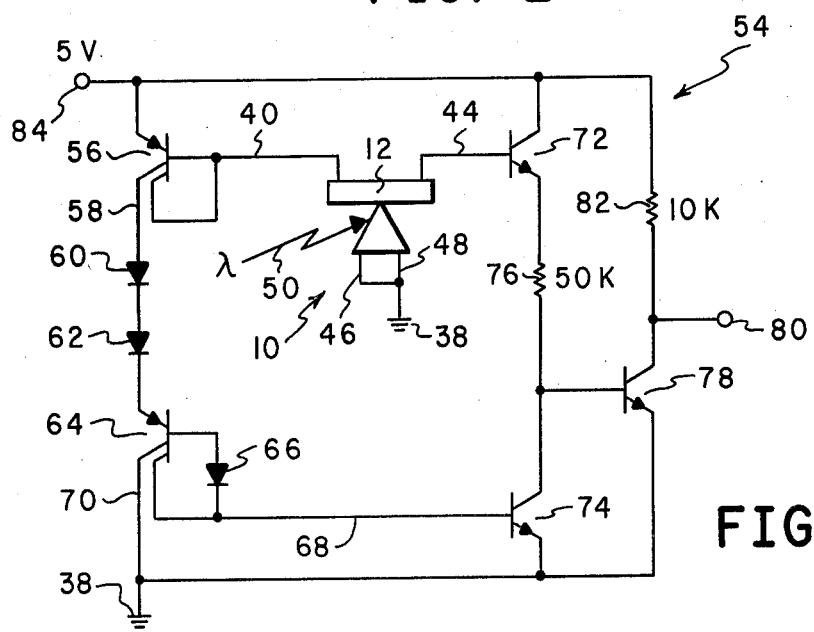
FIG. 3 is a schematic illustration of a circuit utilizing a photodiode in accordance with the present invention.

Referring now to FIG. 3, the present invention can be more easily understood with reference to a circuit 54 which employs photodiode 10 which is represented by a special symbol which was created by the inventor to represent a photodiode according to the present invention. Circuit 54 includes a current splitter comprising lateral PNP double collector transistor 56 which, neglecting the base current of transistor 56, supplies the substantially lateral bias current $I_{40}$ through lead 40 and a substantially equal current $I_{58}$ in lead 58 through level shifting diodes 60 and 62 to the current splitter comprising lateral PNP double collector transistor 64 and base-to-collector diode 66. Ignoring the base current of transistors 64, the current splitter of that transistor splits current $I_{58}$ substantially in halves with $I_{58}/2$ in lead 68 and $I_{58}/2$ in lead 70. Lead 44 connects the second connection of the N-type semiconductor layer 12 of photodiode 10 to the base of transistor 72, and lead 68 connects one of the collectors of transistor 64 to the base of transistor 74. The emitter of transistor 72 is connected through 50K ohms resistor 76 to the collector of transistor 74 and to the base of a transistor 78. Output 80 is taken at the collector of transistor 78. The collector of transistor 78 is connected to a 10K ohms load resistor 82 which is connected to a 5 volts power supply 84 as is the collector of transistor 72 and the emitter of transistor 56.

Lead 40 will be at roughly 4.3 volts, being one emitter-to-base voltage drop from the five volts power supply 84. Lead 44 will also be approximately at 4.3 volts whether or not photodiode 10 is in illumination, neglecting the voltage drop across the substantially lateral region of N-type semiconductor layer 12 which is relatively small due to the low resistance path. The voltage at the emitter of transistor 72 is, therefore, approximately 3.6 volts and, since transistor 78 connects the collector of transistor 74 at one base-to-emitter voltage drop above ground, approximately 2.9 volts is dropped across the 50K ohms resistor 82 as long as the collector of transistor 74 does not pull the base of transistor 78 lower than 0.7 volts. Thus, the current through resistor 76 is approximately 58 microamperes which is approximately $I_{40}$ times the beta of transistor 72, and the collector current of transistor 74 is approximately ($I_{58}/2$) times the beta of transistor 74. Assuming that the betas of transistors 72 and 74 are approximately the same, and knowing that $I_{40}$ is approximately equal to $I_{58}$, then approximately 29 microamperes flows into the base of transistor 78, bringing the collector of transistor 78 low. When photodiode 10 is being illuminated, on the other hand, and we wish output 80 to be high and, therefore, the collector of transistor 74 to be low at approximately 0.3 volts, then almost all of the current through resistor 76 enters the collector of transistor 74, the current being approximately 3.3 volts/50K ohms or approximately 66 microamperes. The 66 microamperes is roughly beta times the current in lead 44 which also equals beta times the current in lead 68. The current in lead 68 is approximately one half the current in lead 58 which means that the current in lead 68 is approximately one half the current in lead 40. Thus, the current in lead 44 must also be about one half the current in lead 40 which is to say that the photocurrent going to ground 38 through phototransistor 10 must be about one half the current in lead 40. Referring to the current in lead 40 as the lateral current and the current going to ground 38 as the photocurrent, then it can be seen that the lateral current should be about twice the photocurrent in such a circuit. If the substantially lateral current is far greater than the photocurrent, then signal will be lost; but if the photocurrent is far greater than the substantially lateral current, on the other hand, then the turn-off time is again slowed down.

From the foregoing it will be seen that this invention is one well adapted to attain all of the ends and objects hereinabove set forth, together with other advantages which are obvious and which are inherent to the apparatus. It will be understood that certain features and subcombinations are of utility and may be employed without reference to other features and subcombinations. This is contemplated by and is within the scope of the claims.

As many possible embodiments may be made of the invention without departing from the scope thereof, it is to be understood that all matter herein set forth or shown in the accompanying drawings is to be interpreted as illustrative and not in a limiting sense.

The invention having been described, what is claimed is:

1. A radiation sensitive solid state device comprising in combination:
   a semiconductor layer of one conductivity type;
   a radiation sensitive element present in the semiconductor layer comprising an electrode situated at or adjacent a first surface and forming a rectifying junction with the semiconductor layer material of the one conductivity type;
   a first connection of the semiconductor layer;
   a second connection of the semiconductor layer spaced apart laterally from the first connection on the opposite side of the radiation sensitive element wherein the semiconductor layer portion situated intermediate said connections forms a low resistance path having a thickness measured from the radiation sensitive element to the edge opposite the radiation sensitive element between roughly about six microns and roughly about seven microns whereby a substantially lateral flow of charge carriers characteristic of the one conductivity type can occur; and
   a connection of the radiation sensitive element.

2. A radiation sensitive solid state device according to claim 1 wherein the electrode consists of a surface region of the opposite conductivity type in the semiconductor layer of the one conductivity type.

3. A radiation sensitive solid state device according to claim 2 wherein the semiconductor layer of the one conductivity type is present on a semiconductor substrate of the opposite conductivity type, the first surface of the semiconductor layer being the surface remote from the substrate.

4. A radiation sensitive solid state device according to claim 3 consisting of a photodiode wherein the semiconductor layer of one conductivity type is an N-type layer and the radiation sensitive element is a P-type element.

5. A radiation sensitive solid state device comprising in combination:
   a semiconductor layer of one conductivity type;
   a radiation sensitive element present in the semiconductor layer comprising an electrode situated at or adjacent a first surface and forming a rectifying junction with the semiconductor layer material of the one conductivity type;
   a first connection of the semiconductor layer;
   a second connection of the semiconductor layer spaced apart laterally from the first connection on the opposite side of the radiation sensitive element wherein the semiconductor layer portion situated intermediate said connections forms a low resistance path having a thickness measured from the radiation sensitive element to the edge opposite the radiation sensitive element of at least roughly about six microns whereby a substantially lateral flow of charge carriers characteristic of the one conductivity type can occur; and
   a connection of the radiation sensitive element.

6. A radiation sensitive solid state device according to claim 5 wherein the electrode consists of a surface region of the opposite conductivity type in the semiconductor layer of the one conductivity type.

7. A radiation sensitive solid state device according to claim 6 wherein the semiconductor layer of the one conductivity type is present on a semiconductor substrate of the opposite conductivity type, the first surface of the semiconductor layer being the surface remote from the substrate.

8. A radiation sensitive solid state device according to claim 7 consisting of a photodiode wherein the semiconductor layer of one conductivity type is an N-type layer and the radiation sensitive element is a P-type element.

9. A method for shortening the turn-off time of a radiation sensitive device having a semiconductor layer of one conductivity type and a radiation sensitive element present in the semiconductor layer comprising an electrode situated at or adjacent a first surface and forming a rectifying junction with the semiconductor layer material of the first conductivity type wherein the semiconductor layer forms a low resistance substantially lateral path beneath the radiation sensitive element, the method comprising providing a substantially lateral flow of carriers characteristic of the one conductivity type through the semiconductor layer beneath the radiation sensitive element wherein the substantially lateral flow of carriers creates a bias current in the range of from roughly about one half of the maximum radiation generated current to roughly about three times the maximum radiation generated current.

10. A method according to claim 9 wherein the substantially lateral flow of carriers creates a bias current in the range of from roughly about 1½ the maximum radiation generated current to roughly about 2½ times the maximum radiation generated current.

11. A radiation sensitive solid state device circuit comprising in combination:
   a radiation sensitive solid state device having a semiconductor layer of one conductivity type and a radiation sensitive element present in the semiconductor layer comprising an electrode situated at or adjacent a first surface and forming a rectifying junction with the semiconductor layer material of the first conductivity type wherein the semiconductor layer forms a low resistance substantially lateral path beneath the radiation sensitive element;
   a first current splitter to split a current into two currents of a known ratio to one another, the two currents being a substantially lateral bias current input to the semiconductor layer of the first conductivity type and a second current;
   a second current splitter to split the second current into two currents of a known ratio to one another, one of the two currents being a comparison current;
   a comparison circuit to compare the current output from the semiconductor layer to the comparison current, the comparison circuit having one output state for when the current output from the semiconductor layer substantially equals the current input to the semiconductor layer and a second output when the current output from the semiconductor layer substantially differs from the current input to the semiconductor layer.

12. A radiation sensitive solid state device circuit according to claim 11 wherein the ratio of the first current splitter is 1, the ratio of the second current splitter is 1, and the comparison circuit subtracts a current substantially equal to a constant times the comparison current from a current substantially equal to the same constant times the current output from the semiconductor layer.

* * * * *